(12) United States Patent
Guha et al.

(10) Patent No.: US 9,627,576 B2
(45) Date of Patent: Apr. 18, 2017

(54) MONOLITHIC TANDEM CHALCOPYRITE-PEROVSKITE PHOTOVOLTAIC DEVICE

(71) Applicant: International Business Machines Corporation, Armonk, NY (US)

(72) Inventors: Supratik Guha, Chappaqua, NY (US); Yun Seog Lee, White Plains, NY (US); Charles Sturdevant, Wappingers Falls, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/491,536

(22) Filed: Sep. 19, 2014

(65) Prior Publication Data
US 2016/0087233 A1 Mar. 24, 2016

(51) Int. Cl.
| | | |
|---|---|---|
| H01L 31/18 | (2006.01) |
| H01L 51/05 | (2006.01) |
| H01L 31/00 | (2006.01) |
| H01L 31/02 | (2006.01) |
| H01L 31/032 | (2006.01) |
| H01L 31/0687 | (2012.01) |
| H01L 31/0224 | (2006.01) |
| H01L 51/42 | (2006.01) |
| H01L 27/30 | (2006.01) |

(Continued)

(52) U.S. Cl.
CPC ........ *H01L 31/1884* (2013.01); *H01L 27/302* (2013.01); *H01L 31/022475* (2013.01); *H01L 31/022483* (2013.01); *H01L 31/022491* (2013.01); *H01L 31/0322* (2013.01); *H01L 31/0687* (2013.01); *H01L 51/4246* (2013.01); *H01L 51/0037* (2013.01); *H01L 2031/0344* (2013.01); *Y02E 10/549* (2013.01)

(58) Field of Classification Search
CPC ..................................................... H01L 27/302
See application file for complete search history.

(56) References Cited

U.S. PATENT DOCUMENTS

| 6,429,318 B1 | 8/2002 | Mitzi |
|---|---|---|
| 6,676,749 B2 | 1/2004 | Era |

(Continued)

OTHER PUBLICATIONS

Harish Sankaranarayanan, Fabrication of CIGS absorber layers using a two-step process for thin film solar cell applications, 2004, University of Florida, pp. 1-140.*

(Continued)

*Primary Examiner* — Francisco Tschen
(74) *Attorney, Agent, or Firm* — Vazken Alexanian; Michael J. Chang, LLC

(57) ABSTRACT

Monolithic tandem chalcopyrite-perovskite photovoltaic devices and techniques for formation thereof are provided. In one aspect, a tandem photovoltaic device is provided. The tandem photovoltaic device includes a substrate; a bottom solar cell on the substrate, the bottom solar cell having a first absorber layer that includes a chalcopyrite material; and a top solar cell monolithically integrated with the bottom solar cell, the top solar cell having a second absorber layer that includes a perovskite material. A monolithic tandem photovoltaic device and method of formation thereof are also provided.

8 Claims, 2 Drawing Sheets

(51) Int. Cl.
*H01L 31/0256* (2006.01)
*H01L 51/00* (2006.01)

(56) References Cited

U.S. PATENT DOCUMENTS

| | | | |
|---|---|---|---|
| 8,586,457 | B1 | 11/2013 | Liang et al. |
| 8,613,973 | B2 | 12/2013 | Mitzi et al. |
| 2001/0046603 | A1* | 11/2001 | Constantino ......... C01G 23/003 428/403 |
| 2002/0066478 | A1* | 6/2002 | Hayashi ............. H01L 31/0236 136/244 |
| 2005/0072461 | A1* | 4/2005 | Kuchinski ........... H01L 31/0322 136/256 |
| 2006/0138453 | A1* | 6/2006 | Thompson ............ B82Y 10/00 257/183 |
| 2009/0126779 | A1* | 5/2009 | Heeger ................ B82Y 10/00 136/249 |
| 2010/0180932 | A1 | 7/2010 | Wang et al. |
| 2010/0282309 | A1* | 11/2010 | Pschirer ................ B82Y 10/00 136/255 |
| 2012/0085411 | A1 | 4/2012 | Isobe et al. |
| 2012/0132256 | A1 | 5/2012 | Sager |
| 2012/0222730 | A1* | 9/2012 | Gunawan ................ H01L 31/18 136/255 |
| 2013/0221415 | A1 | 8/2013 | Regan et al. |
| 2014/0332078 | A1* | 11/2014 | Guo ...................... H01L 51/424 136/261 |

OTHER PUBLICATIONS

Kang et al., Transparent Cu nanowire mesh electrode on flexible substrate fabricated by transfer printing and its application in organic solar cells, Solar Energy Materials and Solar Cells, 2010, 1179-1184.*

Panthani et al., Synthesis of CuInS2, CuInSe2, and Cu(InxGal-x)Se2 (CIGS) Nanocrystal "Inks" for Printable Photovoltaics, J.Am. Chem.Soc, 2008, 130, 16770-16777.*

C. Chen et al., "Efficient perovskite solar cells based on low-temperature solution-processed (CH3NH3) Pbl3 perovskite/CuInS2 planar heterojunctions," Nanoscale Research Letters, vol. 9, No. 1, 2014, Published on-line Aug. 26, 2014.

R. F. Service, "Perovskite Solar Cells Keep on Surging," Science, vol. 344, May 2014, p. 458.

W. Liu et al., "12% Efficiency CuIn (Se, S)2 Photovoltaic Device Prepared Using a Hydrazine Solution Process," Chemistry of Materials, vol. 22, No. 3, 2010, pp. 1010-1014.

Liu et al., "Efficient planar heterojunction perovskite solar cells by vapour deposition," Nature vol. 501, 395-398 (Sep. 2013).

A. Kojima et at, "Organometal Halide Perovskites as Visible-Light Sensitizers for Photovoltaic Cells," Journal of the American Chemical Society, vol. 131, pp. 6050-6051, (Apr. 2009).

Todorov et al., "Solution-processed Cu(In,Ga)(S,Se)2 absorber yielding a 15.2% efficient solar cell," Progress in Photovoltaics: Research and Applications, vol. 21, Issue 1, pp. 82-87 (Jan. 2013).

Leisch et al., "Electrodeposited CIS-based Thin Films for Photoelectrochemical Hydrogen Production," 206th Meeting of the Electrochemical Society (ECS) and 2004 Fall Meeting of the Electrochemical Society of Japan (ECSJ)), Oct. 3-8, 2004, Honolulu, Hawaii.

S.P. Bremner et al., "Analysis of tandem solar cell efficiencies under AM1.5G spectrum using a rapid flux calculation method," Progress in Photovoltaics: Research and Applications vol. 16, Issue 3, pp. 225-233 (May 2008).

Liu et al., "Silver nanowire-based transparent, flexible, and conductive thin film," Nanoscale Research Letters, 6:75 (Jan. 2011).

AbuShama et al., "Properties of ZnO/CdS/CuInSe2 Solar Cells with Improved Performance," Prog. Photovolt: Res. Appl. 2004; 12:39-45 (published Jan. 2004).

Takayuki Negami et al., "Large-area CIGS absorbers prepared by physical vapor deposition," Solar Energy Materials and Solar Cells, vol. 67, Issues 1-4, pp. 1-9 (Mar. 2001).

Dullweber et al., "Back surface band gap gradings in Cu(In,Ga)Se2 solar cells," Thin Solid Films, vol. 387, 11-13 (May 2001).

* cited by examiner

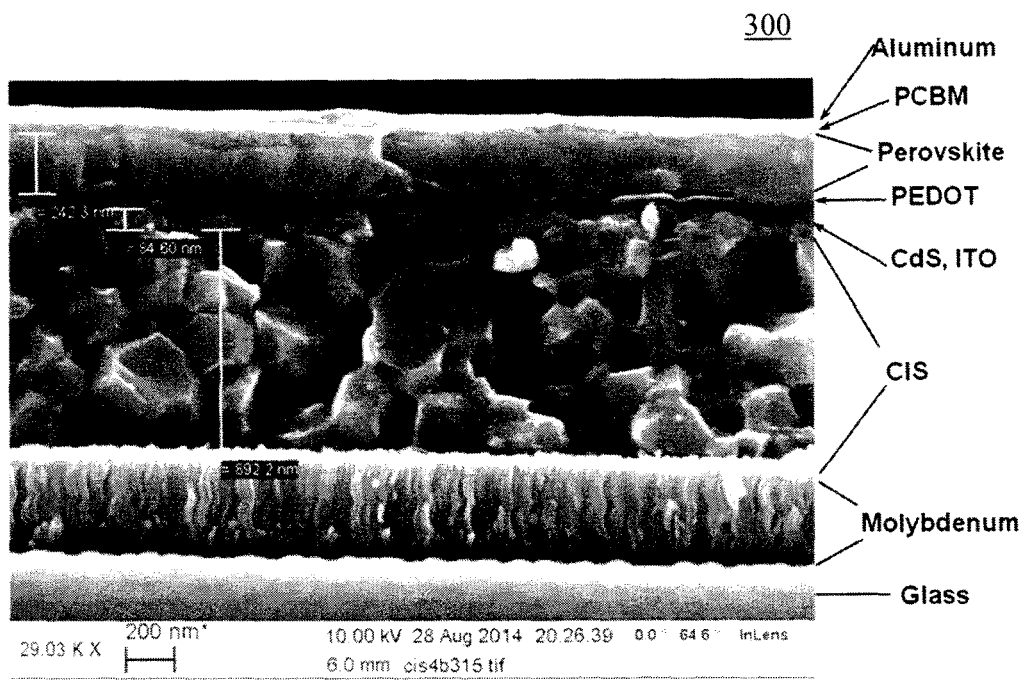
FIG. 3
| | Eff | FF | Voc | Jsc |
|---|---|---|---|---|
| | % | % | mV | mA/cm^2 |
| CIS | 4.5 | 49.7 | 328.5 | 27.5 |
| Perovskite | 6.101 | 48.959 | 709.194 | 17.572 |
| Tandem | 2.596 | 54.848 | 1046.696 | 4.522 |
FIG. 4
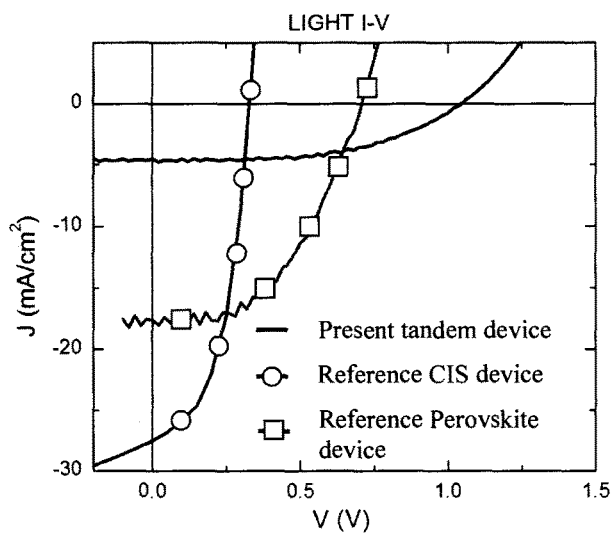
FIG. 5

MONOLITHIC TANDEM CHALCOPYRITE-PEROVSKITE PHOTOVOLTAIC DEVICE

FIELD OF THE INVENTION

The present invention relates to tandem photovoltaic devices and more particularly, to tandem chalcopyrite (e.g., CIS or CIGS)-perovskite photovoltaic devices and techniques for formation thereof.

BACKGROUND OF THE INVENTION

Tandem photovoltaic cells consisting of at least two absorbers with different band gaps allow broader spectrum light harvesting and superior photovoltaic conversion efficiency as compared to single-junction solar cells. Tandem photovoltaic cells are often oriented with one solar cell on top of another. For optimal performance, the bandgap of the absorber in the top solar cell should be higher than the bandgap of the absorber in the bottom solar cell.

Two commonly employed types of tandem device are two-terminal devices and four-terminal devices. Two-terminal tandem devices contain one electrode on top and one electrode on the bottom, with a tunnel junction between the top and bottom solar cells of the device. Four-terminal tandem devices contain independent devices stacked on top of each other, wherein each independent device has its own top and bottom electrodes. Two-terminal tandem devices are more challenging to fabricate than four-terminal tandem devices because two-terminal tandem devices require current-matching between the top and bottom solar cells. Further, care must be taken during fabrication of two-terminal tandem devices to not damage the bottom solar cell during processing of the top solar cell. While having less strict current-matching and processing constraints than two-terminal devices, four-terminal devices nonetheless suffer from significant resistance and optical losses due to their need for multiple transparent conductive contacts and reflection losses associated with the additional substrates and layers.

Chalcogenide-based solar cells such as $CuInSe_2$ (abbreviated as "CIS"), $Cu(In,Ga)(S,Se)$ (abbreviated as "CIGS"), and $Cu_2ZnSn(S,Se)_4$ (abbreviated as "CZT(S,Se)") have achieved their highest efficiency at relatively low bandgap (approximately 1.15 electron volts (eV)). The use of chalcogenide-based solar cells in a tandem device architecture however presents some notable challenges. For instance, for maximum performance, chalcogenide-based solar cells require very high processing temperatures of the absorber layer (above 450 degrees Celsius (° C.)). Thus, chalcogenide-based solar cells often cannot be used as the top solar cell in a tandem device since these high temperatures would degrade the bottom solar cell. Further, the low band gap of a chalcogenide absorber makes chalcogenide solar cells not well-suited for use in a top cell.

Once formed, chalcogenide-based solar cells employ a p-n junction that significantly deteriorates at temperatures above approximately 200° C. Thus, when a chalcogenide-based solar cell is used as the bottom cell, processing temperatures for the top cell must be kept below about 200° C. to maintain the p-n junction in the bottom cell. This requirement can be a challenge meet when using conventional solar devices for the top solar cell.

Therefore, techniques for integrating chalcogenide-based solar cell designs into a tandem photovoltaic device architecture would be desirable.

SUMMARY OF THE INVENTION

The present invention provides monolithic tandem chalcopyrite-perovskite photovoltaic devices and techniques for formation thereof. In one aspect of the invention, a tandem photovoltaic device is provided. The tandem photovoltaic device includes a substrate; a bottom solar cell on the substrate, the bottom solar cell having a first absorber layer that includes a chalcopyrite material; and a top solar cell monolithically integrated with the bottom solar cell, the top solar cell having a second absorber layer that includes a perovskite material.

In another aspect of the invention, a monolithic tandem photovoltaic device is provided. The monolithic tandem photovoltaic device includes a substrate; a layer of electrically conductive material on the substrate; a first absorber layer on a side of the layer of electrically conductive material opposite the substrate, wherein the first absorber layer includes a chalcopyrite material; a buffer layer on a side of the first absorber layer opposite the layer of electrically conductive material; a transparent front contact on a side of the buffer layer opposite the first absorber layer; a hole transporting layer on a side of the transparent front contact opposite the buffer layer; a second absorber layer on a side of the hole transporting layer opposite the transparent front contact, wherein the second absorber layer includes a perovskite material; an electron transporting layer on a side of the second absorber layer opposite the hole transporting layer; and a transparent top electrode on a side of the electron transporting layer opposite the second absorber layer.

In yet another aspect of the invention, a method of forming a monolithic tandem photovoltaic device is provided. The method includes the steps of: coating a substrate with a layer of electrically conductive material; forming a first absorber layer on a side of the layer of electrically conductive material opposite the substrate, wherein the first absorber layer includes a chalcopyrite material; forming a buffer layer on a side of the first absorber layer opposite the layer of electrically conductive material; forming a transparent front contact on a side of the buffer layer opposite the first absorber layer; forming a hole transporting layer on a side of the transparent front contact opposite the buffer layer; forming a second absorber layer on a side of the hole transporting layer opposite the transparent front contact, wherein the second absorber layer includes a perovskite material; forming an electron transporting layer on a side of the second absorber layer opposite the hole transporting layer; and forming a transparent top electrode on a side of the electron transporting layer opposite the second absorber layer.

A more complete understanding of the present invention, as well as further features and advantages of the present invention, will be obtained by reference to the following detailed description and drawings.

BRIEF DESCRIPTION OF THE DRAWINGS

FIG. 3 is a diagram illustrating a cross-sectional scanning electron microscope (SEM) image of a two-solar cell monolithic tandem photovoltaic device formed according to the present techniques according to an embodiment of the present invention;

FIG. 4 is a diagram illustrating performance of the photovoltaic device of FIG. 3 according to an embodiment of the present invention; and FIG. 5 is a diagram illustrating current voltage (J-V) curves of the photovoltaic device of FIG. 3 according to an embodiment of the present invention.

DETAILED DESCRIPTION OF PREFERRED EMBODIMENTS

As provided above, due to their high efficiency at a relatively low band gap (about 1.15 electron volts (eV)) chalcogenide-based solar cells are ideal candidates for the bottom solar cells in a tandem device architecture. However, processing temperature constraints limit the options for what top solar cell may be formed on a chalcogenide-based bottom solar cell. Namely, once formed, the chalcogenide-based bottom solar cell should not be subjected to temperatures in excess of about 200 degrees Celsius (° C.).

Advantageously, the present techniques leverage a new generation of low-cost materials based on methylammonium metal (lead (Pb), tin (Sn)) halide (iodide, chloride, bromide) perovskites which require low processing temperatures (e.g., below 150° C. or even below 80° C.—see below). Perovskite solar cells can have efficiencies exceeding 15%. See, for example, Liu et al., "Efficient planar heterojunction perovskite solar cells by vapour deposition," Nature vol. 501, 395-398 (September 2013), the contents of which are incorporated by reference as if fully set forth herein. Beneficially, these perovskite materials have large band gaps (1.5 eV to 2 eV). See, for example, A. Kojima et al., "Organometal Halide Perovskites as Visible-Light Sensitizers for Photovoltaic Cells," Journal of the American Chemical Society, vol. 131, pp. 6050-6051, (April 2009), the contents of which are incorporated by reference as if fully set forth herein. This combination of low processing temperature, high efficiency, and large band gap make perovskite solar cells ideal partners for the top device in two-terminal tandem structures with chalcogenide solar cells such as CZTSe, CIS and CIGS with low Ga content.

As described above, tandem photovoltaic devices include a top solar cell and a bottom solar cell wherein the band gap of the absorber in the top solar cell is preferably higher than the band gap of the absorber in the bottom solar cell. In a two-terminal tandem photovoltaic device, there is one top electrode and one bottom electrode, and a tunnel junction between the top and bottom solar cells. A tandem, i.e., multi-junction, photovoltaic device architecture allows the combined two-solar cell stack to achieve high open-circuit voltages (Voc) reaching a maximum value of the sum of the two individual (i.e., top and bottom) cell voltages. The total short-circuit current density produced by the tandem photovoltaic device is limited by whichever of the individual solar cells produces the lower current density.

Provided herein are two-terminal monolithic tandem photovoltaic devices having a chalcopyrite-based bottom solar cell and a perovskite-based top solar cell. It is demonstrated below (see, for example, FIG. 4) that in accordance with the present techniques the Voc of the present tandem devices is indeed larger than either of the individual cells and approaches the sum of the two individual Voc values, which thereby demonstrates the tandem concept.

Figure 1:
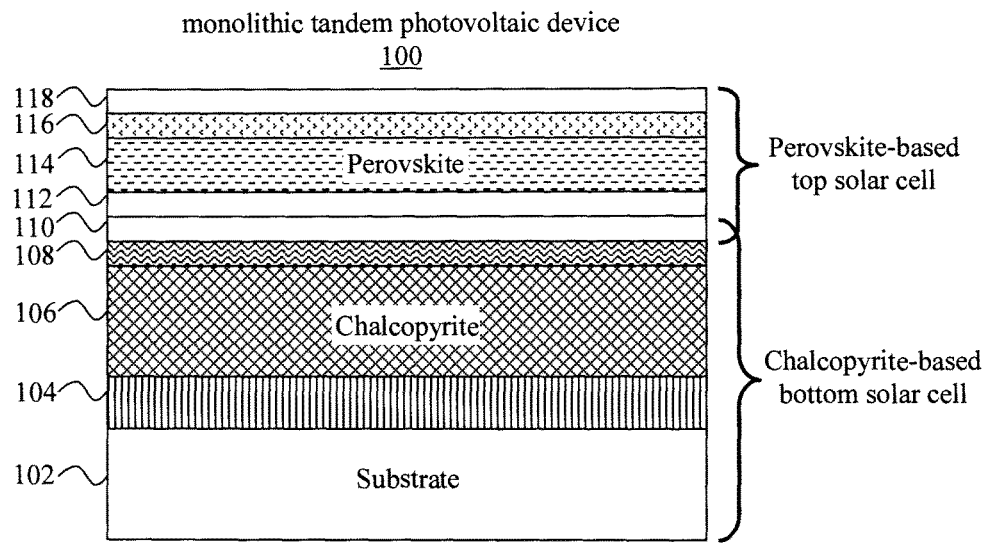
FIG. 1 is a diagram illustrating an exemplary two-terminal, two-solar cell monolithic tandem photovoltaic device according to an embodiment of the present invention.

FIG. 1 is a diagram illustrating an exemplary two-terminal, two-solar cell, monolithic tandem photovoltaic device 100 according to the present techniques. As shown in FIG. 1, the device 100 includes two solar cells, a chalcopyrite-based bottom solar cell (i.e., the absorber in the bottom solar cell is a chalcopyrite material), and a perovskite-based top solar cell (i.e., the absorber in the top solar cell is a perovskite material).

Chalcopyrite absorber materials are chalcogenides which include copper (Cu), at least one of indium (In) and gallium (Ga), and at least one of sulfur (S) and selenium (Se). Exemplary chalcopyrite materials employed herein include, but are not limited to, materials containing Cu, In, and Se—$CuInSe_2$—abbreviated herein as "CIS" and materials containing Cu, at least one of In and Ga, and at least one of S and Se—$Cu(In,Ga)(S,Se)$—abbreviated herein as "CIGS." As this implies, the designation (A,B) such as (In,Ga) and (S,Se) used herein signifies that at least one of A and B is present, i.e., A and/or B. Chalcopyrite-based solar cells are described generally in Todorov et al., "Solution-processed $Cu(In,Ga)(S,Se)_2$ absorber yielding a 15.2% efficient solar cell," Progress in Photovoltaics: Research and Applications, Vol. 21, Issue 1, pgs. 82-87 (January 2013), the contents of which are incorporated by reference as if fully set forth herein.

The term "perovskite," as used herein, refers to materials with a perovskite structure and the general formula $ABX_3$ (e.g., wherein A=$CH_3NH_3$ or NH=$CHNH_3$, B=lead (Pb) or tin (Sn), and X=chlorine (Cl) or bromine (Br) or iodine (I)). The perovskite structure is described and depicted, for example, in U.S. Pat. No. 6,429,318 B1 issued to Mitzi, entitled "Layered Organic-Inorganic Perovskites Having Metal-Deficient Inorganic Frameworks" (hereinafter "Mitzi"), the contents of which are incorporated by reference as if fully set forth herein. As described in Mitzi, perovskites generally have an $ABX_3$ structure with a three-dimensional network of corner-sharing $BX_6$ octahedra, wherein the B component is a metal cation that can adopt an octahedral coordination of X anions, and the A component is a cation located in the 12-fold coordinated holes between the $BX_6$ octahedra. The A component can be an organic or inorganic cation. See, for example, FIGS. 1a and 1b of Mitzi.

The term "monolithic tandem photovoltaic device," as used herein, refers to a device containing two solar cells formed on single substrate as compared, for example, to mechanically stacking two separate devices as described in R. F. Service, "Perovskite Solar Cells Keep On Surging," Science, vol. 344, (May 2014) (hereinafter "Service"). As will be described in detail below, the layers of the present tandem photovoltaic device will be grown monolithically, layer-by-layer on a common substrate. The result is two monolithically-integrated solar cells formed on the common substrate. Further, in accordance with the present techniques, the monolithically-integrated solar cells will be current-matched to one another—see below.

Referring to FIG. 1, the chalcopyrite-based bottom solar cell includes a substrate 102 coated with a layer 104 of an electrically conductive material (or optionally multiple layers represented generally by layer 104), a chalcopyrite absorber layer 106 on a side of the electrically conductive layer 104 opposite the substrate 102, a buffer layer 108 on a side of the chalcopyrite absorber layer 106 opposite the electrically conductive layer 104, and a transparent front contact 110 on a side of the buffer layer 108 opposite the chalcopyrite absorber layer 106.

According to an exemplary embodiment, substrate 102 is a glass, ceramic, or metal substrate, and the electrically conductive layer 104 is formed from molybdenum (Mo), tungsten (W), nickel (Ni), tantalum (Ta), aluminum (Al), platinum (Pt), titanium nitride (TiN), silicon nitride (SiN), and combinations including at least one of the foregoing materials. For instance, the electrically conductive layer 104 may be formed from an alloy containing at least one of these materials, or alternatively from a stack of layers each of which contains at least one of these materials. According to an exemplary embodiment, the electrically conductive layer 104 is coated on substrate 102 to a thickness of greater than about 0.1 micrometers (μm), e.g., from about 0.1 μm to about 2.5 μm, and ranges therebetween.

As provided above, a two-terminal tandem photovoltaic device has one top electrode and one bottom electrode. The electrically conductive layer 104 will serve as the bottom electrode of device 100. In general, the various layers of the device 100 (beginning with the electrically conductive layer 104) will be deposited sequentially onto the (common) substrate 102, one layer upon the next (i.e., monolithically), using a combination of vacuum-based and/or solution-based approaches. Thus, the result will be a monolithic device structure constructed on a single, common substrate (i.e., substrate 102). Such a monolithic tandem perovskite/chalcopyrite device has not been demonstrated before.

According to an exemplary embodiment, the chalcopyrite absorber layer 106 contains Cu, In, and Se ($CuInSe_2$)—i.e., chalcopyrite absorber layer 106 is a CIS material. In that case, chalcopyrite absorber layer 106 does not contain Ga or S, i.e., chalcopyrite absorber layer 106 is both Ga-free and S-free. A Ga-free and S-free CIS chalcopyrite absorber layer is ideal for use as a bottom solar cell absorber layer in the present tandem device since it has a low bandgap (e.g., of about 1.0 eV). However, the present techniques also include embodiments wherein the chalcopyrite absorber layer 106 optionally also includes at least one of Ga and S (Cu(In, Ga)(S,Se)$_2$—i.e., the chalcopyrite absorber layer 106 is a CIGS material. Introducing Ga and/or S increases the bandgap of the chalcopyrite absorber layer 106. By way of example only, a CIS material containing Cu, In, and Se has a bandgap of about 1.0 eV and a CIGS material containing Cu, Ga, and Se has a bandgap of about 1.7 eV. The inclusion of S (e.g., at a ratio of 1:1 with the Se) can be used to further raise the bandgap to about 1.9 eV. See, for example, Leisch et al., "Electrodeposited CIS-based Thin Films for Photoelectrochemical Hydrogen Production," 206$^{th}$ Meeting of The Electrochemical Society (ECS) and 2004 Fall Meeting of The Electrochemical Society of Japan (ECSJ)), 3-8 Oct. 2004, Honolulu, Hi., the contents of which are incorporated by reference as if fully set forth herein. Because band gap above 1.1 eV, especially above 1.2 eV is less desirable for a bottom device in tandem solar cells (see, for example, S. P. Bremner et al., "Analysis of tandem solar cell efficiencies under AM1.5G spectrum using a rapid flux calculation method," Progress in Photovoltaics: Research and Applications Vol. 16, Issue 3, pgs. 225-233 (May 2008), the contents of which are incorporated by reference as if fully set forth herein), in a preferred embodiment the atomic Ga/In ratio, the S/Se ratio and the sum of both ratios is less than 0.2, preferably 0.1. Exemplary processes for forming the chalcopyrite absorber layer 106 will be described in detail below.

The top solar cell and the bottom solar cell in the configuration shown in FIG. 1 are connected in series. Thus, the two cells must be current-matched in order to have a high-performance device. Current-matching in tandem photovoltaic devices is based in large part on the band gap of the absorbers in the individual solar cells. Advantageously, according to the present techniques the band gap of the chalcopyrite absorber layer 106 of the bottom solar cell can be tuned via excluding Ga and/or S altogether (chalcopyrite absorber layer 106 is Ga-free and/or S-free) or by including small amounts of Ga and/or S as described above, in order to achieve a band gap of from about 1.0 eV to about 1.9 eV, and ranges therebetween. As will be described in detail below, irrespective of the chalcopyrite absorber layer 106, the bandgap of the perovskite absorber layer 114 (see below) can also be independently tuned to optimize the current-matching between the top and bottom solar cells.

For optimal performance, the bandgap of the top solar cell absorber in a tandem device should be higher than the bandgap of the bottom solar cell absorber. Thus, device 100 is configured such that the relatively higher bandgap absorber material (i.e., the perovskite absorber layer 114 (see below)) is used in the top solar cell and the relatively lower bandgap absorber material (i.e., the chalcogenide absorber layer 106) is used in the bottom solar cell. Perovskite materials have large bandgaps (e.g., from about 1.5 electron volts (eV) to 3 eV, and ranges therebetween) which makes them well suited as a top solar cell absorber in a tandem device with a low-bandgap bottom cell absorber such as a chalcopyrite (e.g., about 1.0 eV with a Ga-free, S-free CIS absorber—see above).

As highlighted above, using a chalcogenide bottom solar cell configuration presents notable fabrication challenges. For instance, chalcopyrite solar cells may only be used as the bottom solar cell in a two-terminal tandem device when the processing temperature of the top solar cell remains below about 200° C. due to the instability of the chalcopyrite solar cell p-n junction above this temperature. Advantageously, exemplary techniques are implemented herein for low-temperature perovskite formation (see below) to enable a perovskite absorber-based top solar cell to be produced over a chalcopyrite bottom solar cell without damaging the bottom solar cell.

A p-n junction is formed between the buffer layer 108 and the chalcopyrite absorber layer 106. According to an exemplary embodiment, the buffer layer 108 is formed from at least one of cadmium sulfide (CdS), a cadmium-zinc-sulfur material of the formula $Cd_{1-x}Zn_xS$ (wherein 0<x≤1), indium sulfide ($In_2S_3$), zinc oxide, zinc oxysulfide (e.g., a Zn(O,S) or Zn(O,S,OH) material), and aluminum oxide ($Al_2O_3$), and has a thickness of from about 50 angstroms (Å) to about 1,000 Å, and ranges therebetween. According to an exemplary embodiment, the transparent front contact 110 is formed from a transparent conductive oxide (TCO) such as indium-tin-oxide (ITO) and/or aluminum (Al)-doped zinc oxide (ZnO) (AZO).

As its base, the perovskite-based top solar cell has a bottom electrode which, according to an exemplary embodiment, is formed from a TCO such as ITO and/or AZO (the same materials present in the transparent front contact 110). Thus, in the exemplary monolithic embodiment depicted in FIG. 1, the transparent front contact 110 serves as both a top electrode of the chalcopyrite-based bottom solar cell and the bottom electrode of the perovskite-based top solar cell. By comparison, if instead of using the present techniques to monolithically grow the layers of the device one were to mechanically stack one solar cell on top of another, then an additional layer(s) would be present to accommodate for a separate bottom electrode for the top solar cell. Adding additional layers to the stack can disadvantageously serve to block some of the light from reaching the bottom solar cell. See, for example, Service.

As shown in FIG. 1, the perovskite-based top solar cell has a hole transporting layer 112 on a side of the transparent front contact 110 opposite the buffer layer 108, a perovskite absorber layer 114 on a side of the hole transporting layer 112 opposite the transparent front contact 110, an electron transporting layer 116 on a side of the perovskite absorber layer 114 opposite the hole transporting layer 112, and a transparent top electrode 118 on a side of the electron transporting layer 116 opposite the perovskite absorber layer 114.

According to an exemplary embodiment, the hole transporting layer 112 is formed from a hole-transporting material such as poly(3,4-ethylenedioxythiophene)-poly(styrene-sulfonate) (PEDOT:PSS) or molybdenum trioxide ($MoO_3$). As is known in the art, electron holes (or simply "holes") represent the lack or absence of an electron. Electrons and holes are charge carriers in semiconductor materials.

An exemplary process for forming the perovskite absorber layer 114 will be described in detail below. In general however, the process involves synthesizing the perovskite absorber layer 114 from a metal halide film and a source of methylammonium halide vapor. Advantageously, the exemplary perovskite synthesis process employed herein may be carried out under a vacuum in order to lower processing temperatures—thereby preventing any potential p-n junction damage to the underlying chalcopyrite-based bottom solar cell. See above.

As provided above, bandgap tuning of the perovskite absorber layer 114 provides another mechanism by which current-matching between the top and bottom solar cells can be optimized. Bandgap tuning in the perovskite absorber layer 114 can be achieved by varying the halide concentration in the perovskite. This bandgap tuning process for perovskites is described in detail below.

According to an exemplary embodiment, the electron transporting layer 116 is formed from at least one of phenyl-C61-butyric acid methyl ester (PCBM), C60 (Buckminsterfullerene), and bathocuproine (BCP). PCBM, C60, and BCP are hole-blocking, electron-transporting materials.

Transparent top electrode 118 will serve as the top electrode of the (e.g., two-terminal) device 100. According to an exemplary embodiment, transparent top electrode 118 is formed from a thin layer of metal (e.g., a layer of aluminum having a thickness of from about 5 nanometers (nm) to about 50 nm, and ranges therebetween), ITO, AZO, a silver nanowire mesh, or any other material which is both partially transparent in the visible spectrum and electrically conducting. Transparent electrically conductive silver nanowire films are described, for example, in Liu et al., "Silver nanowire-based transparent, flexible, and conductive thin film," Nanoscale Research Letters, 6:75 (January 2011) (hereinafter "Liu"), the contents of which are incorporated by reference as if fully set forth herein. As shown, for example, in FIG. 2 of Liu, silver nanowires form a web-like film which is porous and also transparent.

Device 100 is a two-terminal, monolithic tandem photovoltaic device. Two-terminal means that only two electrodes of the device 100 need to be contacted: one on top, and one on the bottom (for example, layer 104 of electrically conductive material and transparent top electrode 118 in FIG. 1, or the aluminum on top and the molybdenum on the bottom in FIG. 3—described below). The "electrodes" in the middle which complete the chalcopyrite-based bottom solar cell and begin the perovskite-based top solar cell (e.g., ITO or AZO/PEDOT:PSS) act as a "tunnel junction" such that electrons from the bottom solar cell move "upwards" and recombine with holes in the top solar cell that are moving "downwards" (i.e., effectively what is left as current from the device is holes from the bottom cell moving "downwards" and electrons from the top cell moving "upwards").

Figure 2:
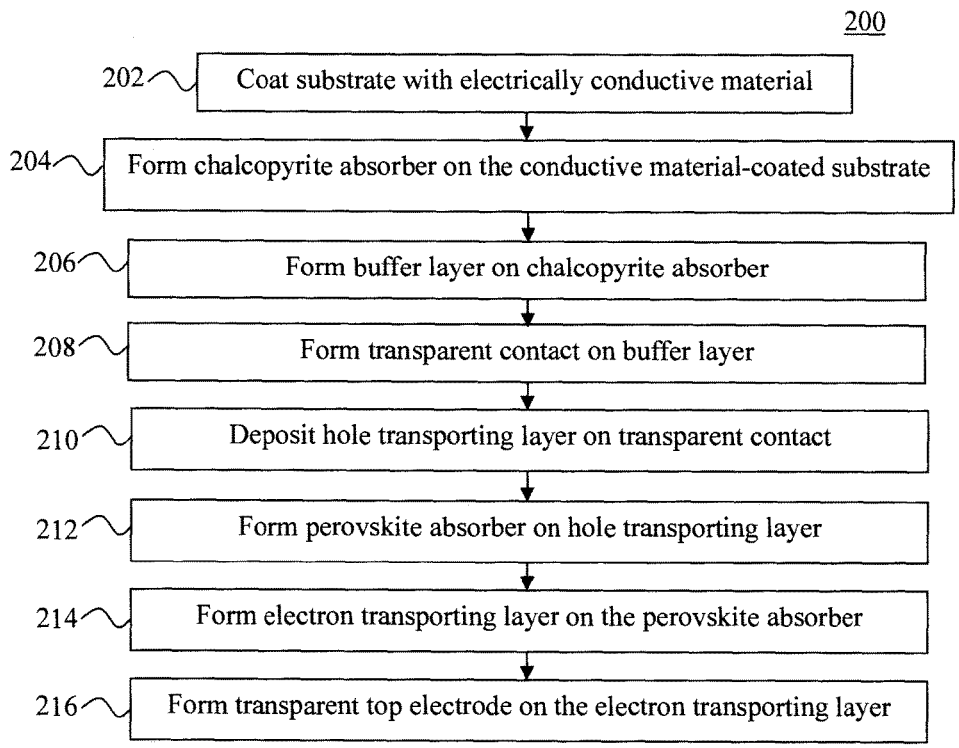
FIG. 2 is a diagram illustrating an exemplary methodology for forming a two-terminal, two-solar cell monolithic tandem photovoltaic device according to an embodiment of the present invention.

An exemplary process for forming the present tandem photovoltaic devices is now described by way of reference to FIG. 2. Specifically, FIG. 2 is a diagram illustrating an exemplary methodology 200 for forming a two-terminal, two-solar cell monolithic tandem photovoltaic device, such as device 100 of FIG. 1. For consistency, the reference numerals from FIG. 1 will be used here as well to refer to the same layers of the photovoltaic device. As highlighted above, the present device is formed monolithically layer-by-layer from the bottom up on a common substrate with the result being a chalcopyrite-based bottom solar cell and a current-matched perovskite-based top solar cell formed on the common substrate. Accordingly, the starting platform for the fabrication process is substrate 102 which in step 202 is coated with a layer(s) of an electrically conductive material 104. As provided above, suitable substrates include, but are not limited to, glass, ceramic, metal foil, or plastic substrates. Suitable electrically conductive materials for electrically conductive layer 104 include, but are not limited to, Mo, Ni, Ta, W, Al, Pt, TiN, SiN, and combinations including at least one of the foregoing materials (for example as an alloy of one or more of these materials or as a stack of multiple layers of these materials). By way of example only, electrically conductive layer 104 can be formed on the substrate 102 using evaporation or sputtering.

In step 204, the chalcopyrite absorber layer 106 is formed on a side of the electrically conductive layer 104 opposite the substrate 102. As provided above, in one exemplary embodiment the chalcopyrite absorber layer 106 contains Cu, In, and Se ($CuInSe_2$)—i.e., chalcopyrite absorber layer 106 is a CIS material. In that case, chalcopyrite absorber layer 106 is both Ga-free and S-free (which can be beneficial for the bottom solar cell absorber layer in the present tandem device since Ga-free and S-free CIS has a low bandgap (e.g., of about 1.0 eV)). In another exemplary embodiment the chalcopyrite absorber layer 106 optionally further includes (in addition to Cu, In, and Se) at least one of Ga and S ($Cu(In,Ga)(S,Se)_2$)—i.e., the chalcopyrite absorber layer 106 is a CIGS material.

Chalcopyrite absorber layer 106 may be formed using any suitable vacuum-based or solution-based approach. By way of example only, suitable deposition techniques include, but are not limited to, vapor deposition, coevaporation, physical vapor deposition (PVD) (i.e., sputtering), etc.

Formation of a CIS material using co-evaporation is described, for example, in AbuShama et al., "Properties of ZnO/CdS/$CuInSe_2$ Solar Cells with Improved Performance," Prog. Photovolt: Res. Appl. 2004; 12:39-45 (published January 2004), the contents of which are incorporated by reference as if fully set forth herein, and Takayuki Negami et al., "Large-area CIGS absorbers prepared by physical vapor deposition," Solar Energy Materials and Solar Cells, volume 67, Issues 1-4, pgs. 1-9 (March 2001), the contents of which are incorporated by reference as if fully set forth herein, and sputtering of a CIGS material is described, for example, in U.S. Pat. No. 8,586,457 issued to Liang et al., entitled "Method of fabricating high efficiency CIGS solar cells," (hereinafter "U.S. Pat. No. 8,586,457"), the contents of which are incorporated by reference as if fully set forth herein. In U.S. Pat. No. 8,586,457 a Cu, In, and Ga-containing precursor film is deposited by sputtering from binary Cu—Ga and In sputter targets. Alternatively, the chalcopyrite absorber may be formed as a stack of layers wherein the sequence of the layers in the stack is configured so as to achieve optimal band grading and/or adhesion to the substrate 102, as is known in the art. See, for example, Dullweber et al., "Back surface band gap gradings in Cu(In, Ga)Se$_2$ solar cells," Thin Solid Films, vol. 387, 11-13 (May 2001), the contents of which are incorporated by reference as if fully set forth herein. Solution-based deposition processes are described, for example, in U.S. Pat. No. 8,613,973 issued to Mitzi et al., entitled "Photovoltaic device with solution-processed chalcogenide absorber layer," the contents of which are incorporated by reference as if fully set forth herein, and in W. Liu et al., "12% Efficiency CuIn(Se,S)$_2$ Photovoltaic Device Prepared Using a Hydrazine Solution Process," Chem. Mater., 2010, 22(3), pp. 1010-1014 (published August 2009) (hereinafter "Liu"), the contents of which are incorporated by reference as if fully set forth herein.

For optimal performance, the bandgap of the top solar cell absorber in a tandem device should be higher than the bandgap of the bottom solar cell absorber. In order to achieve a low bandgap best suited for the bottom solar cell absorber, the chalcopyrite absorber layer 106 according to a preferred embodiment is both Ga-free and S-free. As described above, the inclusion of Ga and/or S in the chalcopyrite absorber layer 106 increases the bandgap. Namely, as described above, for optimal performance the bandgap of the bottom solar cell absorber should be configured to be lower than the bandgap of the top solar cell absorber in order to current-match the solar cells. With a perovskite-based top solar cell absorber having a bandgap of from about 1.5 eV to 3 eV, and ranges therebetween, a bottom solar cell absorber having a bandgap of about 1.0 eV—as is achieved with a Ga-free and S-free CIS material—suitable current-matched is achieved. However, including Ga and/or S (i.e., CIGS) in the chalcopyrite absorber layer 106 can be used, if so desired, to increase the bandgap of the chalcopyrite absorber layer 106 relative to the bandgap of the perovskite top solar cell absorber. As provided above, the bandgap of the chalcopyrite absorber layer 106 can be adjusted (using G and/or S) to from about 1.0 eV to about 1.9 eV, and ranges therebetween. Having the ability to independently tune the bandgap of the top and bottom solar cell absorbers is one advantageous feature of the present techniques.

As is known in the art, either during or following deposition of the chalcopyrite absorber layer materials an anneal in a chalcogen-containing environment is preferably performed. Especially in low-temperature deposition approaches such as sputtering or ink-based, as-deposited materials have poor grain structure and defects. An anneal in a chalcogen environment improves the grain structure and defect landscape in the material. The concentration and type of chalcogen sources, i.e., sulfur (if present in the material) and/or selenium sources such as but not limited to S, Se, H$_2$S and H$_2$Se can be further used to control the final S/Se ratio in the material and therefore control the final bandgap.

In step 206, the buffer layer 108 is formed on a side of the chalcopyrite absorber layer 106 opposite the electrically conductive layer 104. As provided above, suitable materials for forming buffer layer 108 include, but are not limited to, at least one of CdS, a cadmium-zinc-sulfur material of the formula Cd$_{1-x}$Zn$_x$S (wherein 0<x≤1), In$_2$S$_3$, zinc oxide, zinc oxysulfide (e.g., a Zn(O,S) or Zn(O,S,OH) material), and Al$_2$O$_3$. According to an exemplary embodiment, the buffer layer 108 is formed on the chalcopyrite absorber layer 106 using standard chemical bath deposition.

In step 208, the transparent front contact 110 is formed on a side of the buffer layer 108 opposite the chalcopyrite absorber layer 106. As provided above, suitable materials for forming the transparent front contact 110 include, but are not limited to, a transparent conductive oxide (TCO) such as ITO and/or AZO. According to an exemplary embodiment, the transparent front contact 110 is formed on the buffer layer 108 by sputtering. As provided above, the transparent front contact 110 serves as both a top electrode of the chalcopyrite-based bottom solar cell and the bottom electrode of the perovskite-based top solar cell in the present monolithically integrated tandem solar cell design. Thus, formation of the transparent front contact 110 on the buffer layer 108 completes fabrication of the chalcopyrite-based bottom solar cell, and is the first step in fabricating the perovskite-based top solar cell.

The next step in forming the perovskite-based top solar cell is to deposit the hole transporting layer 112 on a side of the transparent front contact 110 opposite the buffer layer 108. This is performed in step 210. As provided above, suitable materials for forming the hole transporting layer 112 include, but are not limited to, PEDOT:PSS, MoO$_3$, or any other hole-transporting material that makes ohmic contact to the perovskite. According to an exemplary embodiment, the hole transporting layer 112 is deposited onto the transparent front contact 110 using a spin-coating or evaporation process.

As highlighted above, in a two-terminal, tandem photovoltaic device a "tunnel junction" is needed between the top and bottom electrodes that facilitates recombination between electrons from the bottom solar cell and holes from the top solar cell. The transparent front contact 110/hole transporting layer 112 (e.g., ITO or AZO/PEDOT:PSS) junction is the tunnel junction in this case, as holes transported through the hole transporting layer 112 recombine with electrons transported through the transparent front contact 110.

In step 212, the perovskite absorber layer 114 is formed on a side of the hole transporting layer 112 opposite the transparent front contact 110. According to an exemplary embodiment, the perovskite absorber layer 114 is formed on the hole transporting layer 112 using the techniques described in U.S. patent application Ser. No. 14/449,420, entitled "Techniques for Perovskite Layer Crystallization" (hereinafter "U.S. patent application Ser. No. 14/449,420") the contents of which are incorporated by reference as if fully set forth herein. In general, the techniques described in U.S. patent application Ser. No. 14/449,420 involve using vacuum annealing of a metal halide (e.g., lead or tin iodide, chloride or bromide) and a methylammonium halide source (e.g., methylammonium iodide, methylammonium bromide, and methylammonium chloride) to create a methylammonium halide vapor which reacts with the metal halide to form a perovskite material. One notable advantage of the techniques presented in U.S. patent application Ser. No. 14/449,420 is that annealing under a vacuum permits significantly lower reaction temperatures than those used in other processes. For instance, temperatures below 150° C., e.g., from about 60° to about 150° C., and ranges therebetween can be employed. As described above, once formed, a chalcopyrite-based bottom solar cell should not be subjected to processing temperatures exceeding about 200° C. so as to prevent degradation of the p-n junction.

Another notable advantage of the techniques presented in U.S. patent application Ser. No. 14/449,420 is that they provide for optional real-time monitoring of the reaction to optimize the properties of the perovskite based on the changing optical properties of the reactants as the perovskite is being formed. Reaction and monitoring set-ups are presented in U.S. patent application Ser. No. 14/449,420 that permit real-time transmission (in the case of transparent samples) and reflective (in the case of non-transparent samples) measurements to be made.

Yet another notable advantage of the techniques presented in U.S. patent application Ser. No. 14/449,420 is that they permit formation of high-quality, uniform perovskite layers over large device areas. Specifically, the methylammonium halide source may be a methylammonium halide-coated substrate placed facing, and in close proximity to, the metal halide during the vacuum annealing. This configuration permits uniform perovskite formation on large device substrates.

As provided above, the bandgap of the bottom solar cell absorber and the bandgap of the top solar cell absorber can be independently tuned. This capability advantageously ensures proper current-matching between the top and bottom solar cells. Bandgap tuning of the bottom cell chalcopyrite absorber was described in detail above. With regard to the perovskite absorber, the bandgap can be varied by varying the metal halide composition in the perovskite. For instance, in the exemplary perovskite formation process described above the starting metal halide layer (which reacts with the methylammonium vapor) has the formula $MX_2$, wherein M is lead (Pb) and/or tin (Sn), and X is at least one of fluorine (F), chlorine (Cl), bromine (Br), and/or iodine (I). Lead- and tin-based perovskite materials have different bandgaps. For instance, a lead-free perovskite $CH_3NH_3SnI_3$ has a bandgap of 1.23 eV while a pure-lead perovskite $CH_3NH_3PbI_3$ has a bandgap of about 1.55 eV. Changing the halide composition of the perovskite can also affect bandgap. For example, the material $CH_3NH_3PbBr_3$ has a band gap of about 2.25 eV. The optimum bandgap for the top solar cell in the present chalcopyrite/perovskite-based tandem device is about 1.7 eV for a bottom solar cell band gap of about 1.0 eV (e.g., which is achievable using a Ga-free and S-free CIS absorber—see above). A perovskite absorber bandgap of about 1.7 eV could be achieved by slightly increasing the bandgap of the $CH_3NH_3PbI_3$ (1.55 eV) via the introduction of Cl or Br. Alternatively, a perovskite absorber bandgap of 1.7 eV could be achieved by starting with $CH_3NH_3SnI_3$ (1.23 eV) and adding significantly more Cl or Br. The effects of adding Cl and/or Br to a pure iodide perovskite sample are illustrated in U.S. patent application Ser. No. 14/449,486, entitled "Tandem Kesterite-Perovskite Photovoltaic Device" (hereinafter "U.S. patent application Ser. No. 14/449,486") the contents of which are incorporated by reference as if fully set forth herein. Specifically, U.S. patent application Ser. No. 14/449,486 provides metal halide samples containing iodide alone (pure iodide), iodide/chloride, iodide/bromide, and iodide/chloride/bromide which illustrate a transition from darker to lighter as the chlorine and bromine are added to the pure-iodide perovskite. The lighter coloration of the samples is due to a reduction in light absorption to the larger bandgap of the material.

Next, in step 214 electron transporting layer 116 is formed on a side of the perovskite absorber layer 114 opposite the hole transporting layer 112. As provided above, suitable materials for forming the electron transporting layer 116 include, but are not limited to, at least one of PCBM, C60, and BCP. According to an exemplary embodiment, the electron transporting layer 116 is deposited onto the perovskite absorber layer 114 using a spin-coating or evaporation process.

Finally, in step 216 the transparent top electrode 118 is formed on a side of the electron transporting layer 116 opposite the perovskite absorber layer 114. As provided above, suitable materials for forming the transparent top electrode 118 include, but are not limited to, a thin layer of metal (e.g., aluminum (Al)), ITO, AZO, or a silver nanowire mesh. A thin aluminum layer can be formed using evaporation. ITO and AZO are often deposited using sputtering or a chemical vapor deposition (CVD)-based process. Alternatively, a layer of ITO or AZO nanoparticles could be coated from a suspension on top of the device. Silver nanowire meshes can be prepared using various solution-based processes such as spray-coating from a suspension in alcohol. Formation of the transparent top electrode 118 completes the device.

The present techniques are further described by way of reference to the following non-limiting example:

A CIS (i.e., Ga-free and S-free) solar cell was prepared (similarly to the process described in Liu) as follows: a solution of 1.683 grams (g) $In_2Se_3$ and 0.680 g Se in 25 milliliters (ml) hydrazine was mixed with a solution of 0.389 g Cu and 0.289 g S in 4 ml hydrazine. Five layers of the mixed solution were spin-coated on a molybdenum-coated glass substrate at 600 revolutions per minute (RPM) and annealed on a hot plate set at 540° C. A buffer layer (in this example CdS) was then deposited onto the CZT(S,Se) to form a p-n junction, and then a ZnO/ITO bilayer electrode was sputtered on top to complete the bottom solar cell.

A layer of PEDOT was spin-coated on top of the bottom solar cell at 3,000 RPM and annealed at 140° C. for 15 minutes. A layer of perovskite was deposited according to the process described in U.S. patent application Ser. No. 14/449,420. $PbI_2$ layers were prepared by spin-coating 0.8 molar (M) $PbI_2$ in Dimethylformamide (DMF) at 2,000 RPM. The sample was placed in the annealing apparatus described in U.S. patent application Ser. No. 14/449,420 in the presence of a close-spaced methylammonium iodide source and treated at 80° C. for 12 hours. A layer of 2% PCBM was coated on top of the perovskite layer and a thin aluminum layer (sheet resistance 200-1,000 ohm square and approximately 30% transmission) was deposited on top.

FIG. 3 shows a cross-sectional scanning electron microscope (SEM) image 300 of the monolithic tandem chalcopyrite/perovskite device formed in the above example. Each layer in the stack is identified on the right side of the image. An open circuit voltage (Voc) of 1047 millivolts (mV) was measured for this device (see FIG. 4), effectively demonstrating a tandem two-terminal photovoltaic device of a chalcopyrite (Voc approximately 329 mV) and a perovskite (Voc approximately 709 mV) solar cell. FIG. 4 illustrates further characteristics of the device, including efficiency (Eff), fill factor (FF), and short circuit current density (Jsc). A current voltage (J-V) curve of the tandem device of FIG. 3, along with a reference CIS device and a reference perovskite device are shown in FIG. 5.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a monolithic tandem photovoltaic device, the method comprising the steps of:
   coating a substrate with an electrically conductive material;
   forming a first absorber layer on a side of the electrically conductive material opposite the substrate, wherein the first absorber layer comprises a chalcopyrite material and, during the forming of the first absorber layer, tuning a bandgap of the first absorber layer to be from about 1.0 eV to about 1.9 eV;
   forming a buffer layer on a side of the first absorber layer opposite the electrically conductive material;

forming a transparent front contact on a side of the buffer layer opposite the first absorber layer;

forming a hole transporting layer on a side of the transparent front contact opposite the buffer layer;

forming a second absorber layer on a side of the hole transporting layer opposite the transparent front contact, wherein the second absorber layer comprises a perovskite material and, during the forming of the second absorber layer, tuning a bandgap of the second absorber layer to be from about 1.5 eV to 3 eV;

forming an electron transporting layer on a side of the second absorber layer opposite the hole transporting layer; and forming a transparent top electrode on a side of the electron transporting layer opposite the second absorber layer.

2. The method of claim 1, wherein the chalcopyrite material comprises copper, indium, and selenium, and wherein the chalcopyrite material is gallium-free.

3. The method of claim 1, wherein the second absorber layer is formed at a temperature of from about 60° C. to about 150° C.

4. The method of claim 1, wherein the coating step comprises the step of:

forming the electrically conductive material on the substrate as a stack of layers each of which contains at least one material selected from the group consisting of: molybdenum, tungsten, nickel, tantalum, aluminum, platinum, titanium nitride, silicon nitride, and combinations thereof.

5. The method of claim 1, wherein the chalcopyrite material is sulfur-free.

6. The method of claim 1, wherein the transparent top electrode is formed from a layer of metal having a thickness of from about 5 nanometers to about 50 nanometers.

7. The method of claim 1, wherein the tuning of the bandgap of the first absorber layer comprises the step of:

varying a composition of the chalcopyrite material.

8. The method of claim 1, wherein the tuning of the bandgap of the second absorber layer comprises the step of:

varying a metal halide composition in the perovskite material.

* * * * *